United States Patent
Tucker et al.

(10) Patent No.: US 6,362,977 B1
(45) Date of Patent: Mar. 26, 2002

(54) EMI CONTAINMENT ASSEMBLY FOR AN INTEGRATED CIRCUIT CHIP

(75) Inventors: Sean W Tucker, Loveland; Arlen L Roesner, Ft. Collins; Samuel M. Babb, Ft. Collins; Kristina L Mann, Fort Collins, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/552,740

(22) Filed: Apr. 19, 2000

(51) Int. Cl.$^7$ .................................................. H05K 9/00
(52) U.S. Cl. ........................ 361/818; 361/800; 361/816; 174/35 R
(58) Field of Search ................................ 361/690, 698, 361/699, 700, 704, 719, 800, 801, 816, 818; 174/35 R, 15.2, 35 GC, 35 MS; 165/80.3

(56) References Cited

U.S. PATENT DOCUMENTS

| | | | | |
|---|---|---|---|---|
| 5,357,404 A | * | 10/1994 | Bright et al. ................ | 361/818 |
| 5,473,510 A | * | 12/1995 | Dozier, II .................... | 361/719 |
| 5,740,013 A | | 4/1998 | Roesner et al. ............. | 361/697 |
| 6,061,235 A | * | 5/2000 | Cromwell et al. .......... | 361/690 |
| 6,205,026 B1 | * | 3/2001 | Wong et al. ................. | 361/704 |

* cited by examiner

Primary Examiner—Jayprakash N. Gandhi
(74) Attorney, Agent, or Firm—Kevin M. Hart

(57) ABSTRACT

An EMI containment assembly for an integrated circuit chip. A frame forms an eletrically conductive wall around the perimeter of the integrated circuit chip. The bottom of the frame makes an electrically conductive contact with a ground trace on the printed circuit board to which the chip is mounted. The top of the frame makes an electrically conductive contact with an electrically conductive heat removal assembly that is disposed over the top of the chip. An electrically conductive bolster plate is mounted on the side of the printed circuit board opposite the integrated circuit chip and is disposed beneath the chip. Because each component of the assembly is electrically conductive, the assembly creates an EMI cage around the integrated circuit chip. Because the frame does not cover the top of the chip, it does not interfere with a thermally conductive contact that is made between the top of the chip package and the heat removal assembly. The assembly of the invention not only provides containment of EMI generated by the integrated circuit chip in a light-weight and cost-effective manner, but it also enables the heat removal assembly to function as effectively as if no EMI containment mechanism were present.

6 Claims, 8 Drawing Sheets

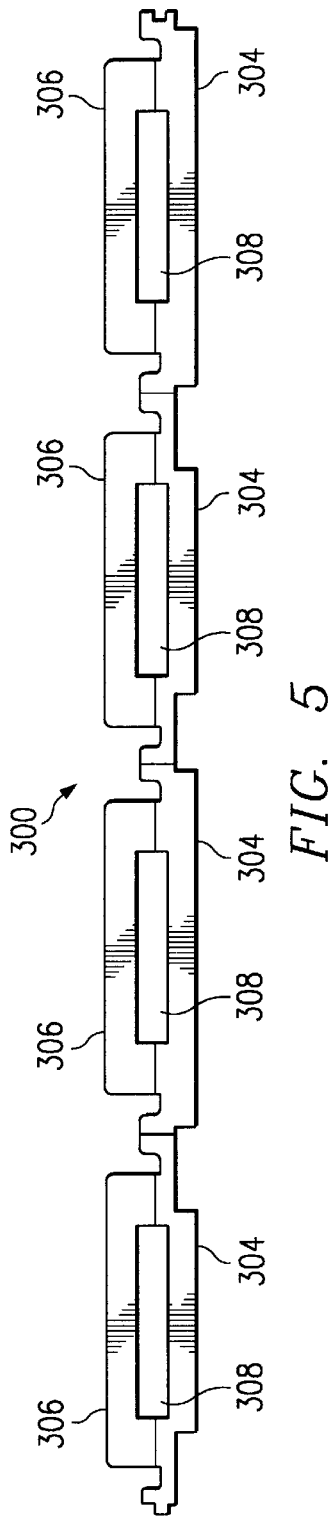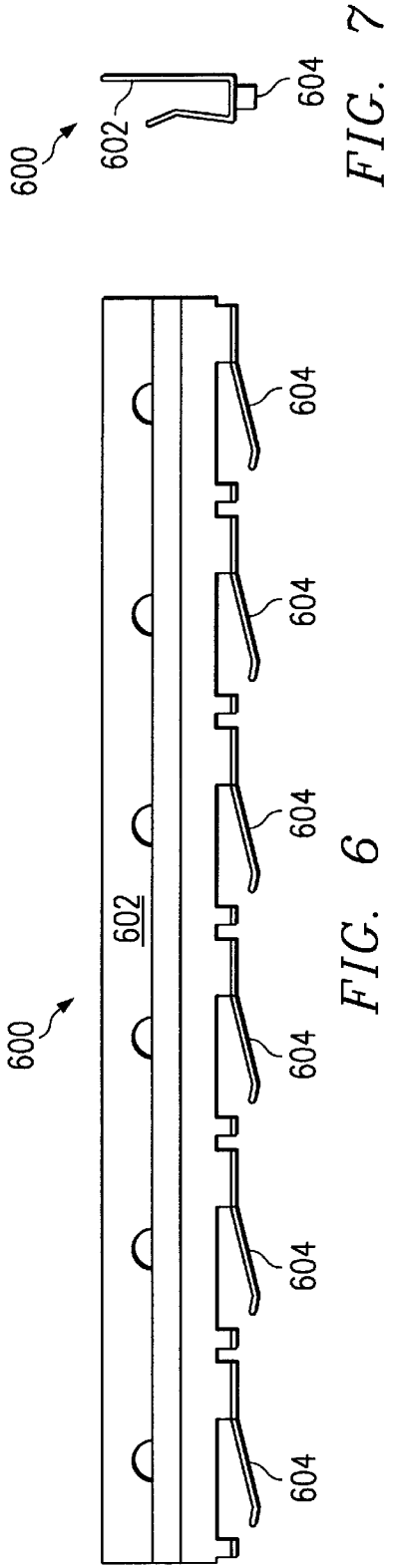

EMI CONTAINMENT ASSEMBLY FOR AN INTEGRATED CIRCUIT CHIP

FIELD OF THE INVENTION

This invention relates to electromagnetic interference (EMI) containment in electronic systems. More particularly, the invention relates to the containment of EMI that is generated in and around an integrated circuit.

BACKGROUND

Digital electronic systems such as computers tend to radiate electromagnetic energy. Generally this radiated electromagnetic energy is unwanted because it may interfere with the operation of other electronic systems located near the radiating system. This phenomenon is know as electromagnetic interference ("EMI") and radio frequency interference ("RFI"). Throughout this document, the term EMI will be used to refer both to EMI and RFI. Government regulations exist in the United States and other countries that specify legal maxima for EMI caused by electronic products. It is therefore important to design electronic products so that the electromagnetic energy generated within them is minimized or effectively contained.

High-speed digital integrated circuit chips such as microprocessors are particularly prominent generators of EMI. Integrated circuit chips of this type also generate a relatively large amount of heat energy, which energy must be removed from the chip or redistributed so that the chip will not overheat and fail.

A need therefore exists for a technique that will help to contain the EMI generated by an integrated circuit chip without impeding the removal of heat from the integrated circuit chip.

SUMMARY OF THE INVENTION

In one aspect, the invention includes an EMI containment assembly for an integrated circuit chip. A frame forms an electrically conductive wall around the perimeter of the integrated circuit chip. The bottom of the frame makes an electrically conductive contact with a ground trace on the printed circuit board to which the chip is mounted. The top of the frame makes an electrically conductive contact with an electrically conductive heat removal assembly that is disposed over the top of the chip. An electrically conductive bolster plate is mounted on the side of the printed circuit board opposite the integrated circuit chip and is disposed beneath the chip. Because each component of the assembly is electrically conductive, the assembly creates an EMI cage around the integrated circuit chip. The EMI cage so created is effective to contain EMI generated within the chip. Because the frame does not cover the top of the chip, it does not interfere with the thermally conductive contact that must be made between the top of the chip package and the heat removal assembly. Thus, the assembly of the invention not only provides containment of EMI generated by the integrated circuit chip in a light-weight and cost-effective manner, but it also enables the heat removal assembly to function as effectively as if no EMI containment mechanism were present.

BRIEF DESCRIPTION OF THE DRAWINGS

FIG. 5 is an unfolded plan view of the EMI frame of FIG. 1.

FIG. 6 is a side view of one of the four beryllium copper EMI gaskets of FIG. .1

FIG. 7 is.an end view of the beryllium copper EMI gasket of FIG. 6.

DETAILED DESCRIPTION OF THE PREFERRED EMBODIMENTS

Figure 1:
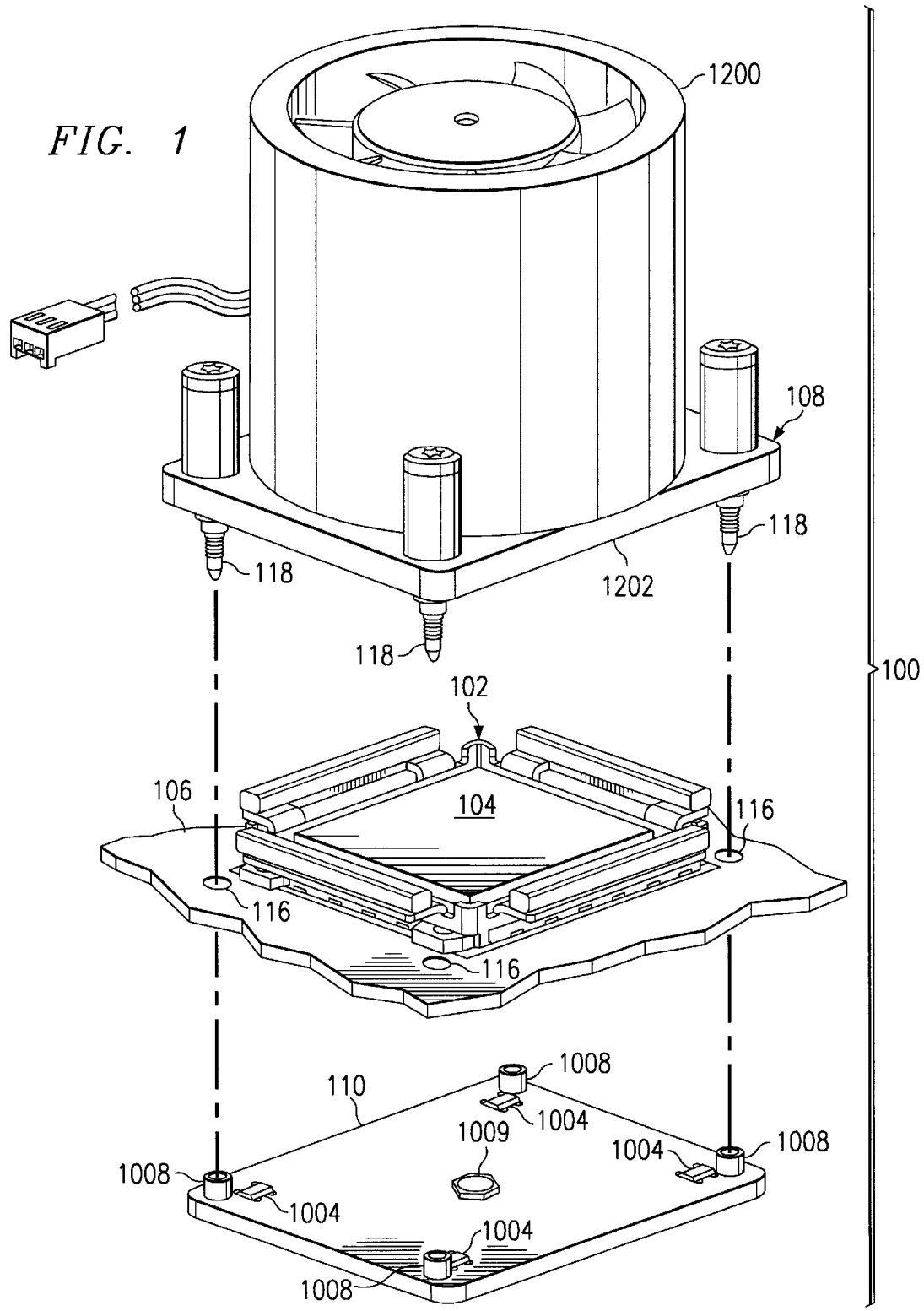
FIG. 1 is an exploded oblique top view of an EMI containment assembly for an integrated circuit chip according to a preferred embodiment of the invention.
Figure 2:
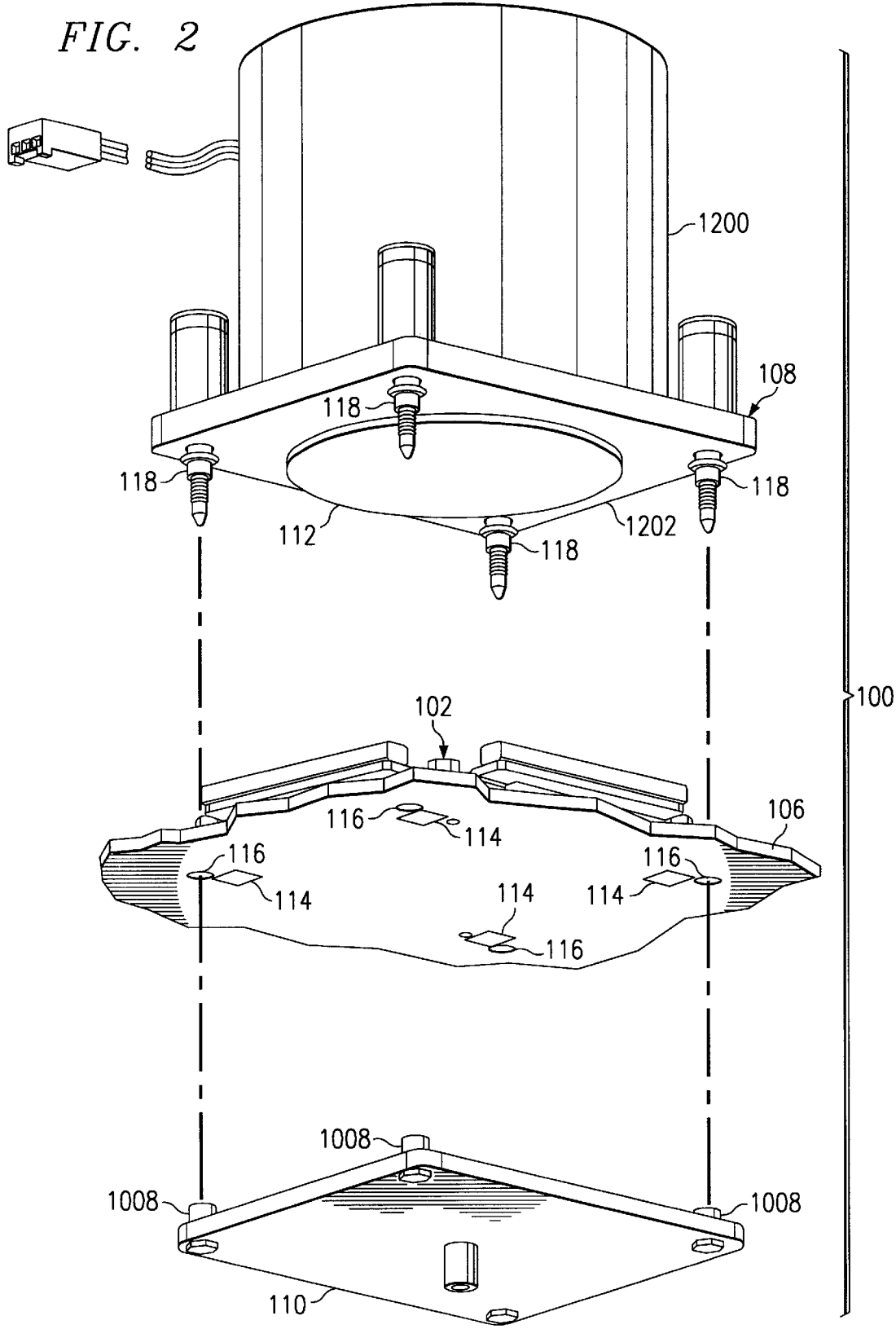
FIG. 2 is an exploded oblique bottom view of the EMI containment assembly of FIG. 1.

FIGS. 1 and 2 illustrate an EMI containment assembly 100 for an integrated circuit chip according to a preferred embodiment of the invention. An EMI frame assembly 102 fits around the perimeter of an integrated circuit chip-and-socket assembly 104. Chip-and-socket assembly 104 mounts to a printed circuit board 106. An electrically conductive cover (in the illustrated embodiment, a heat removal assembly 108) mounts over EMI frame assembly 102 and chip-and-socket assembly 104 and bolts into a bolster plate 110 as shown.

Figure 3:
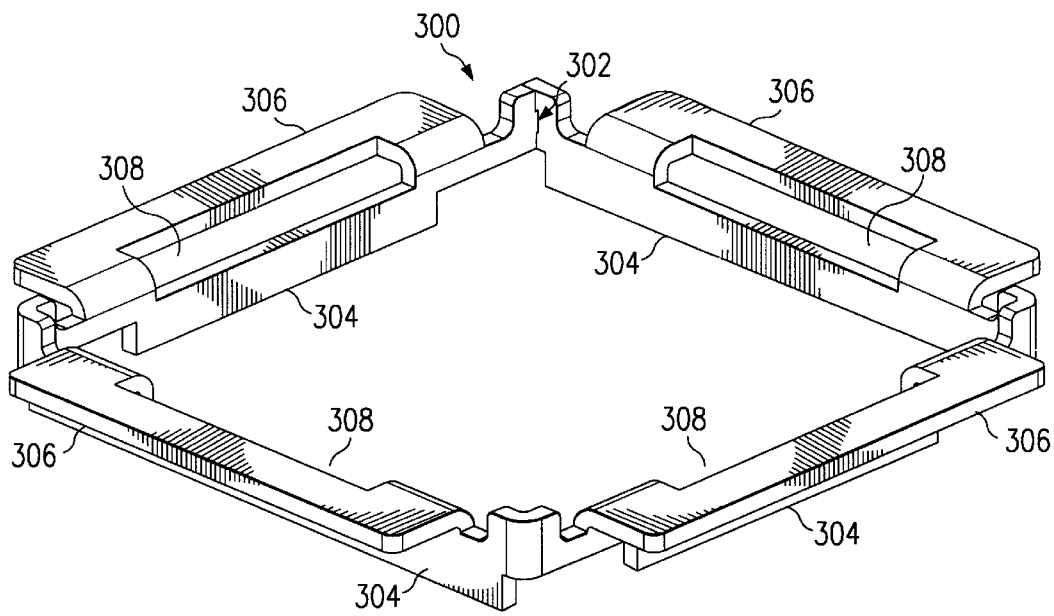
FIG. 3 is a top oblique view of the EMI frame of FIG. 1.
Figure 4:
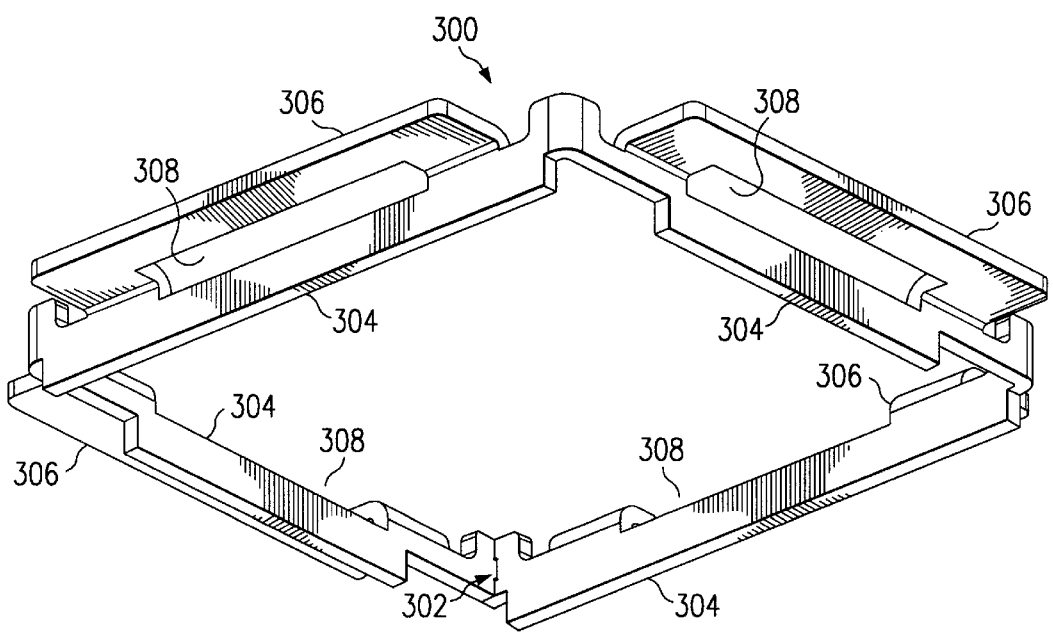
FIG. 4 is a bottom oblique view of the EMI frame of FIG. 1.

EMI frame assembly 102 includes an electrically conductive frame 300 as shown in FIGS. 3, 4 and 5. In an embodiment, frame 300 was fabricated from a single piece of nickel plated carbon steel as shown in FIG. 5. The piece was then folded to the configuration shown in FIGS. 3 and 4. A spot weld was applied at point 302 where the ends of the piece were brought together to form the frame. In its final folded configuration, frame 300 includes four vertical members 304 and four horizontal members 306. Four clearance slots 308 are provided at the points where horizontal members 306 and vertical members 304 meet. In an embodiment, clearance slots 308 were provided to accommodate a circular base portion 112 of heat removal assembly 108.

One clip-on EMI gasket 600 as shown in FIGS. 6 and 7 is attached to each of the four vertical members 304. In an embodiment, clip-on gasket 600 was formed of beryllium copper and included a clip portion 602 and plural resilient fingers 604 extending downward therefrom. One type of gasket suitable for this purpose may be purchased, for example, from Instrument Specialties, Inc. under the product designation "divider edge shield" and the product number 97-654.

One additional EMI gasket 802 was mounted to each of the horizontal members 306 of frame 300 as shown in FIG.

8. In an embodiment, gaskets 802 were made with foam-filled conductive fabric and were adhesively mounted to frame 300. EMI gaskets of this type may be purchased, for example, from Schlegel, Inc. in strips under the product number E7469T08400.

Figure 8:
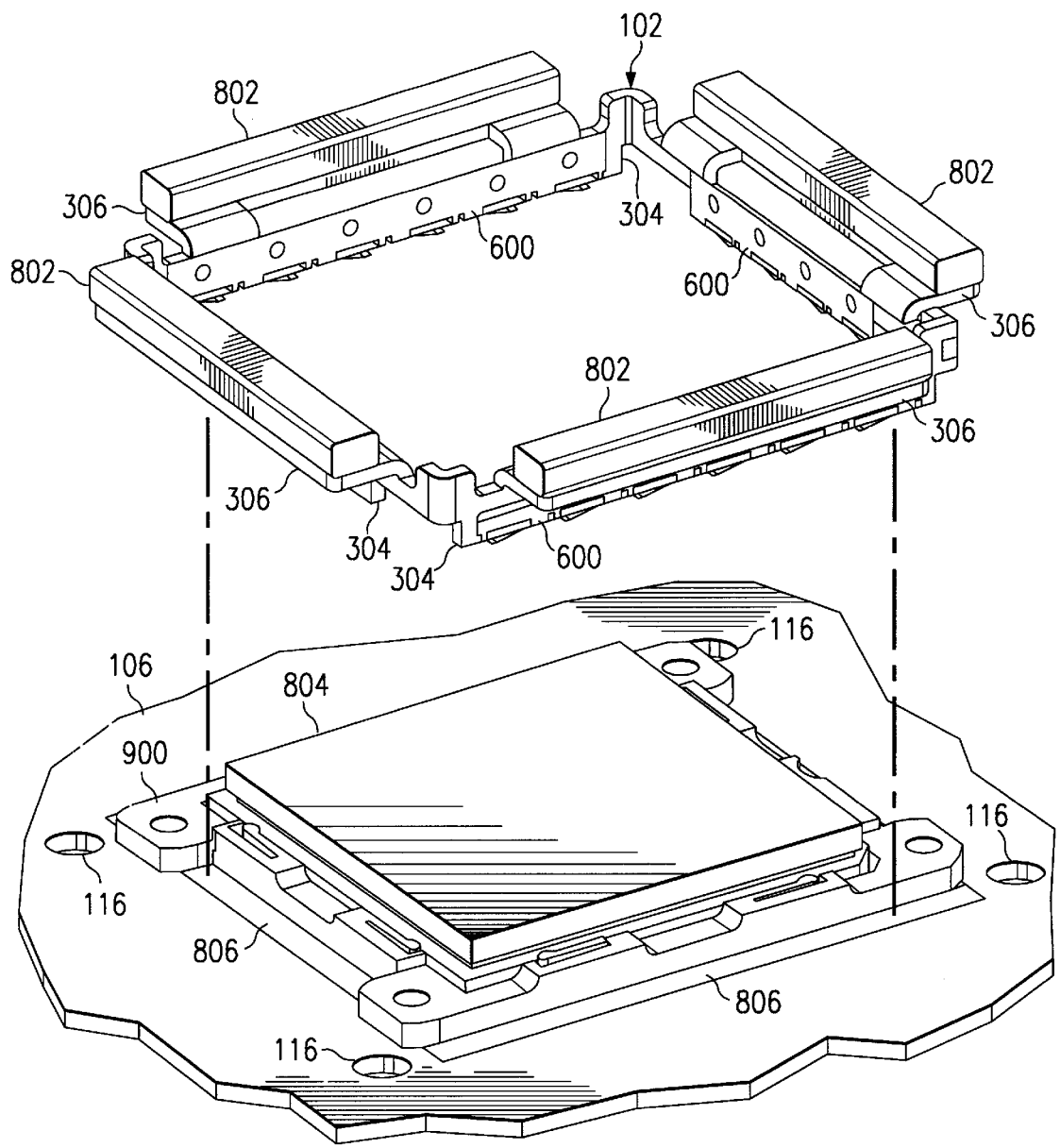
FIG. 8 is an exploded oblique top view of the EMI frame assembly and the integrated,circuit chip and socket assembly of FIG. 1.
Figure 9:
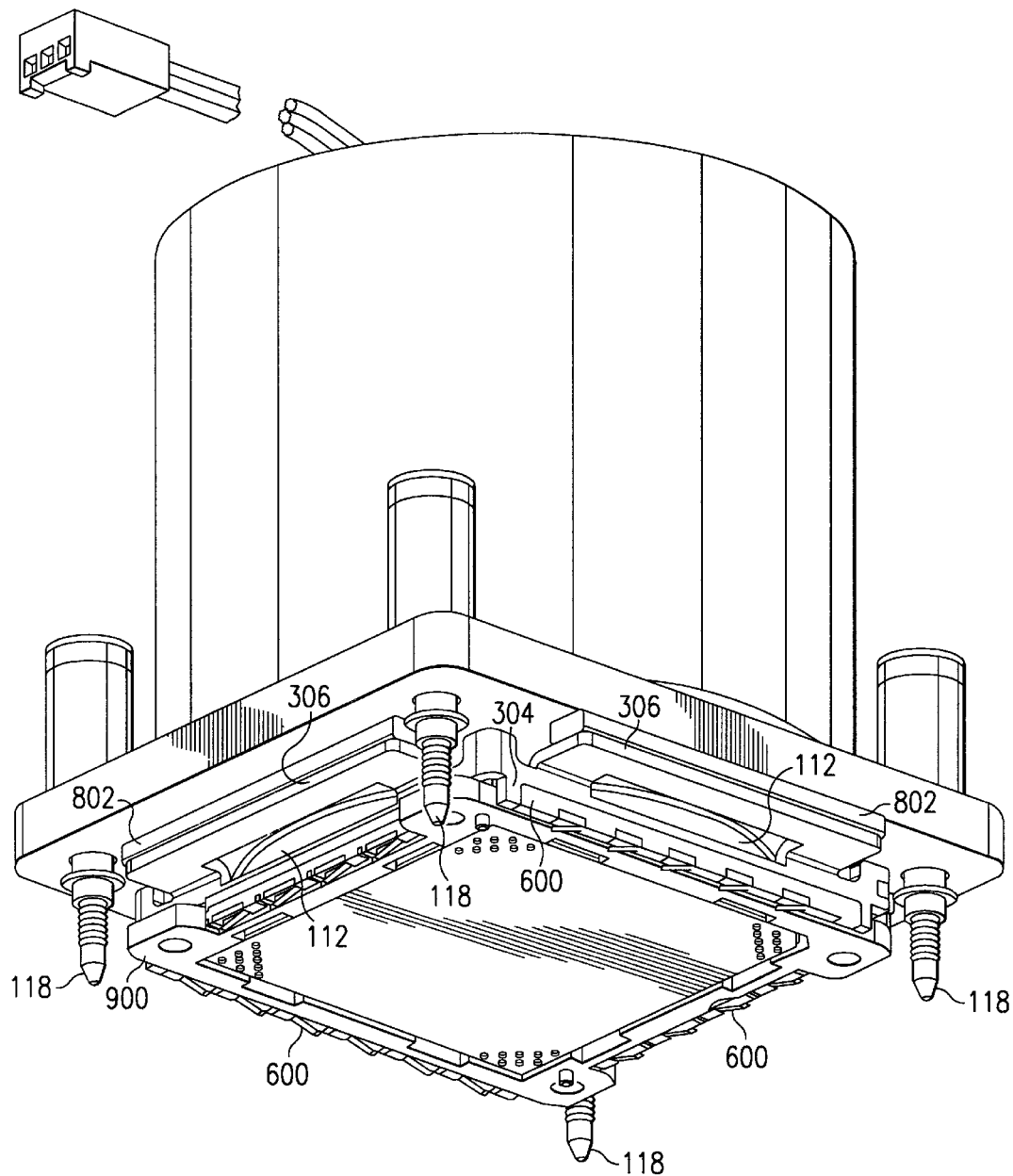
FIG. 9 is a bottom oblique view of the EMI frame assembly, the integrated circuit chip and socket assembly, and the heat removal assembly of FIG. 1.

In the illustrated embodiment, integrated circuit chip-and-socket assembly 104 has a form factor that would be typical for a modem microprocessor chip. (Other chip form factors may, of course, be accommodated with minor variations in dimensions.) Socket 900 has the same generally rectangular-shape as the integrated circuit that it receives, and vertical members 304 of frame 300 fit against the outside of each of the four edges of socket 900 as shown in FIGS. 8 and 9. Printed circuit board 106 has a generally rectangular ground trace 806 etched onto it around the perimeter of socket 900. When frame 300 is slipped over socket 900, EMI gaskets 600 make an electrically conductive contact between ground trace 806 and vertical members 304 of frame 300. Vertical members 304 are substantially orthogonal to the plane of printed circuit board 106, and horizontal members 306 are substantially parallel to the plane of printed circuit board 106.

Figure 10:
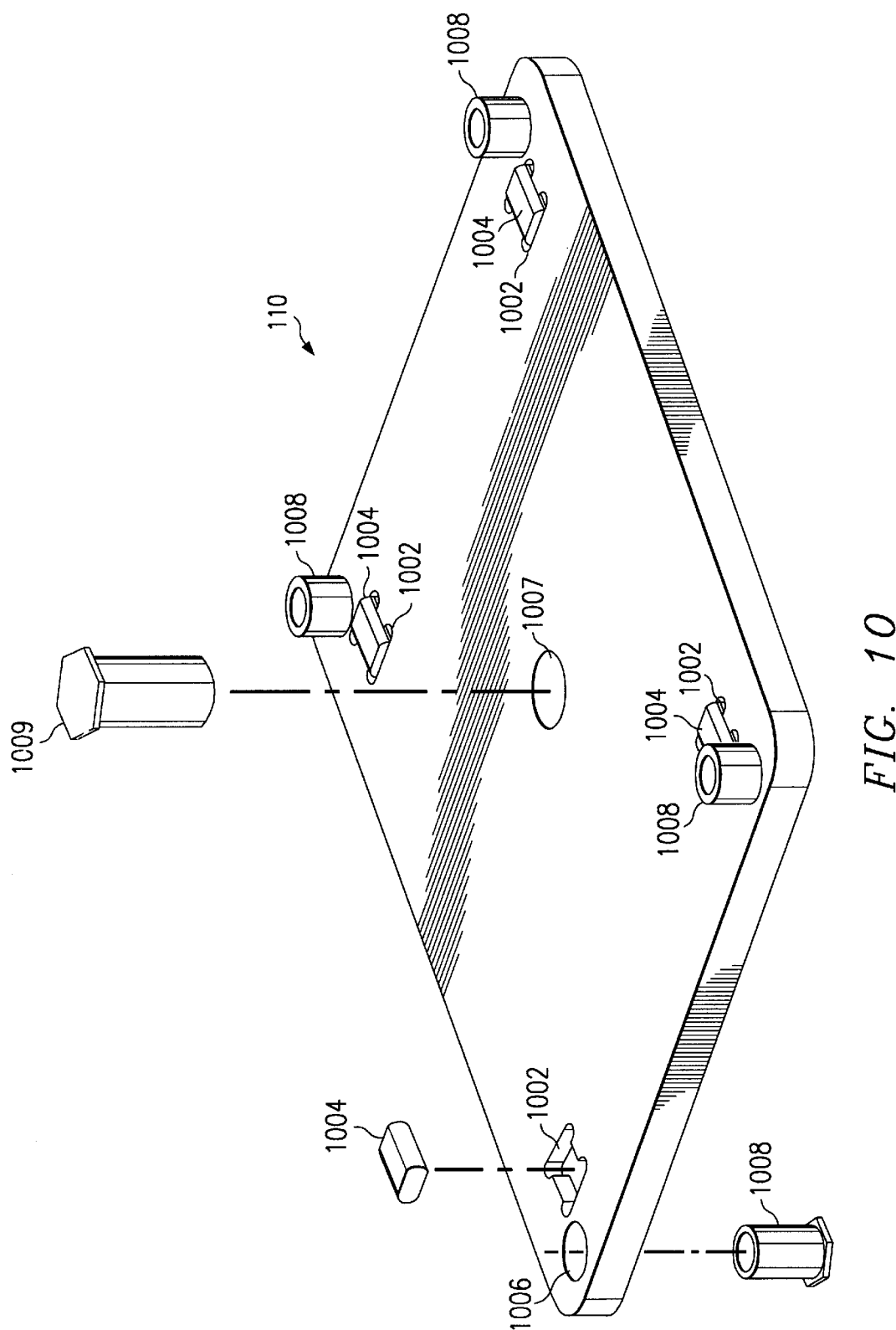
FIG. 10 is a partially-exploded oblique top view of the bolster plate assembly of FIG. 1

Bolster plate 110 (shown in detail in FIG. 10) mounts to the side of printed circuit board 106 opposite chip-and-socket assembly 104. In an embodiment, bolster plate 110 was fashioned with nickel plated carbon steel and included recesses 1002 for receiving four electrically conductive pads 1004. Pads 1004 were made of the same material as were gaskets 802 and were mounted within recesses 1002 adhesively. (Although pads 1004 and gaskets 802 were made of the same type of material, their profiles were different. Specifically, Schlegel Inc. part number E8169T08400 was used to make pads 1004.) Four threaded standoffs 1008 were fitted into clearance holes 1006 in bolster plate 110 as shown and pass through clearance holes 116 in printed circuit board 106. Bolts 118 on heat removal assembly 108 engage threaded standoffs 1008 to secure assembly 100 together.

Four ground traces 114 (see FIG. 2) are formed on the side of printed circuit board 106 opposite chip-and-socket assembly 104 and are positioned to make electrically conductive contact with bolster plate 110 via pads 802 when bolster plate 110 is installed.

An additional threaded standoff extends through a hole 1007 in the center of bolster plate 110 in a direction opposite to that of threaded standoffs 1008. A bolt attached to the host computer chassis or other structural support member of an enclosure may be used to engage standoff f0O7, thereby providing additional; structural support for assembly 100.

Heat removal assembly 108 may take a variety of forms. In the illustrated embodiment, heat removal assembly 108 included an electrically conductive base portion 1202 which included a thermally and electrically conductive circular area 112. In the illustrated embodiment, heat removal assembly 108 also included a fan-driven cylindrical heat exchanger 1200. In such an embodiment, heat removal is facilitated by contact between circular base area 112 and the top of the integrated circuit chip package. In order that circular base area 112 could be accommodated while still allowing frame 300 to fit closely around the perimeter of socket 900, clearance slots 308 were provided. In alternative embodiments, heat removal assembly 108 may be replaced with a heat removal assembly of different type or may be replaced altogether with a simple electrically conductive cover.

Figure 11:
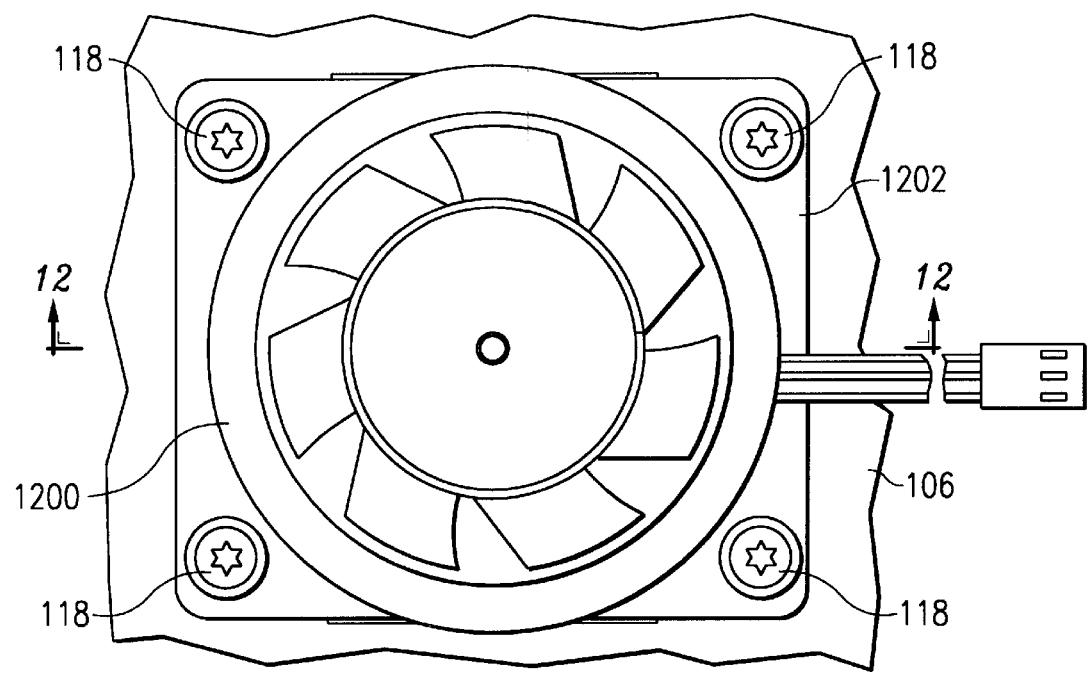
FIG. 11 is a top view of the completed assembly of FIG. 1.
Figure 12:
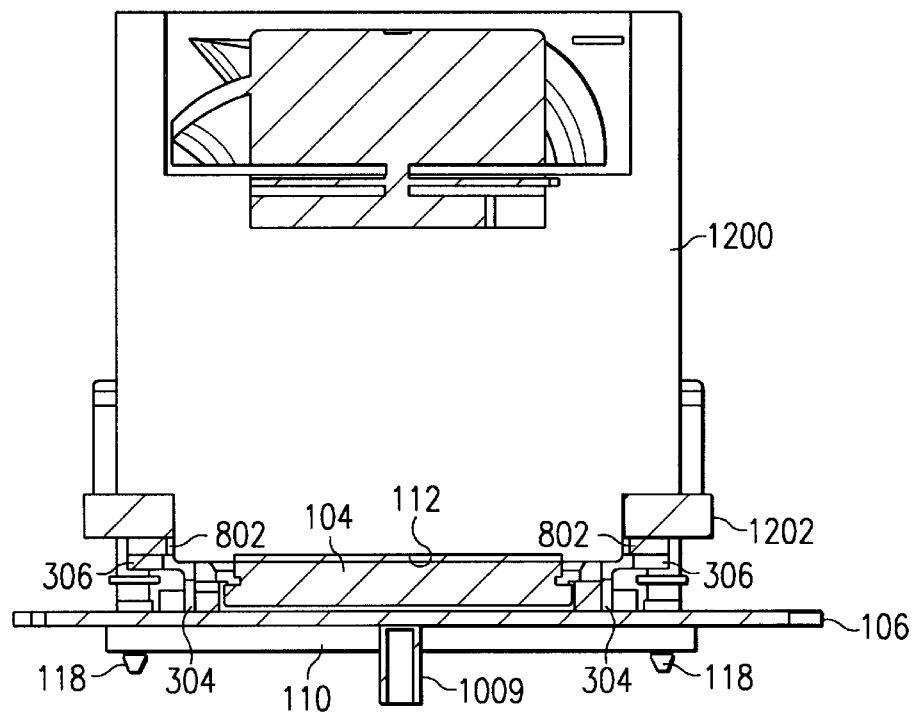
FIG. 12 is a sectional view of the completed assembly of FIG. 1 taken across section A–A indicated in FIG. 11.

In FIG. 12 (which is a sectional view as indicated in FIG. 11) illustrates how EMI containment assembly 100 forms a kind of EMI cage around chip-and-socket assembly 104. Specifically, base portion 1202 and circular area 112 of heat removal assembly 108 provide an electrically conductive cover over the top of chip-and-socket assembly 104. Frame 300 and EMI gaskets 802, 600 provide an electrically conductive wall around the perimeter of chip-and-socket assembly 104. And bolster plate 110 provides an electrically conductive floor underneath chip-and-socket assembly 104. Added EMI containment benefits are provided the grounding of the entire assembly via the ground traces formed on printed circuit board 106 and via threaded standoff 109. Because frame 300 does not cover the top of chip-and-socket assembly 104, it does not interfere with the effectiveness of heat removal assembly 108. In addition, EMI containment assembly 100 is light-weight and cost-effective to manufacture.

While the invention has been described in detail in relation to a preferred embodiment thereof, the described embodiment has been -presented by way of example and not by way of limitation. It will be understood by those skilled in the art that various changes may be made in the form and details of the described embodiment without deviating from the spirit and scope of the invention as defined by the appended claims.

What is claimed is:

1. An EMI containment assembly for an integrated circuit package, comprising:
   an electrically conductive frame having plural vertical members adapted to fit around the perimeter of the package such that each of the vertical members is disposed adjacent to a side of the package and substantially orthogonal to a printed circuit board on which the package is mounted;
   flange members integrally formed at the top of and substantially orthogonal to each of the vertical members;
   at least one bottom EMI gasket clipped at the bottom of the vertical members and including plural resilient fingers for engagement with a first ground trace formed on the printed circuit board; and
   at least one top EMI gasket adhesively coupled to a top surface of the flange members and including a resilient surface for engagement with an electrically conductive portion of a heat removal assembly.

2. The EMI containment assembly of claim 1, wherein the resilient surface is formed with a conductive fabric.

3. The EMI containment assembly of claim 1, further comprising:
   an electrically conductive bolster plate adapted to be mounted on the side of the printed circuit board opposite the package and adapted to make an electrically conductive contact with a second ground trace formed on the printed circuit board; and
   at least one electrically conductive bolster plate pad for making the electrically conductive contact with the second ground trace; wherein
   the at least one electrically conductive bolster plate pad comprises resilient conductive fabric.

4. The EMI containment assembly of claim 1, wherein:

a base portion of the heat removal assembly includes a thermally conductive circular area;

the frame has four sides; and each of the four frame sides defines a clearance slot for accommodating the thermally conductive circular area.

5. The EMI containment assembly of claim 1, further comprising:

an electrically conductive bolster plate adapted to be mounted on the side of the printed circuit board opposite the package and adapted to make an electrically conductive contact with a second ground trace formed on the printed circuit board;

wherein the bolster plate includes a threaded standoff for anchoring the bolster plate to a structural support within a computer enclosure.

6. The EMI containment assembly of claim 1, further comprising:

an electrically conductive bolster plate adapted to be mounted on the side of the printed circuit board opposite the package and adapted to make an electrically conductive contact with a second ground trace formed on the printed circuit board;

wherein the bolster plate includes plural threaded standoffs for coupling the bolster plate to the heat removal assembly through the printed circuit board.

* * * * *